US006843848B2

(12) United States Patent
Von Ammon et al.

(10) Patent No.: US 6,843,848 B2
(45) Date of Patent: Jan. 18, 2005

(54) SEMICONDUCTOR WAFER MADE FROM SILICON AND METHOD FOR PRODUCING THE SEMICONDUCTOR WAFER

(75) Inventors: Wilfried Von Ammon, Hochburg/Ach (AT); Rüdiger Schmolke, Burghausen (DE); Erich Daub, Emmerting (DE); Christoph Frey, Burghausen (DE)

(73) Assignee: Siltronic AG, Munich (DE)

( * ) Notice: Subject to any disclaimer, the term of this patent is extended or adjusted under 35 U.S.C. 154(b) by 148 days.

(21) Appl. No.: 09/813,240

(22) Filed: Mar. 20, 2001

(65) Prior Publication Data

US 2001/0023941 A1 Sep. 27, 2001

(30) Foreign Application Priority Data

Mar. 24, 2000  (DE) .......................................... 100 14 650

(51) Int. Cl.⁷ .............................................. C30B 15/00
(52) U.S. Cl. .............................. 117/19; 117/13; 117/34
(58) Field of Search ......................... 117/13, 17, 19–21, 117/34, 84; 438/906; 437/83–84; 257/620

(56) References Cited

U.S. PATENT DOCUMENTS

| | | | |
|---|---|---|---|
| 3,660,062 A | | 5/1972 | Vieller |
| 4,210,486 A | * | 7/1980 | Schmidt et al. ............. 156/601 |
| 4,330,361 A | * | 5/1982 | Kuhn-Kuhnenfeldt et al. ........................... 156/617 |
| 5,505,157 A | | 4/1996 | Hara et al. |
| 5,641,353 A | | 6/1997 | Hara et al. |
| 5,935,320 A | | 8/1999 | Graef et al. |
| 5,942,032 A | * | 8/1999 | Kim et al. ..................... 117/13 |
| 6,036,932 A | * | 3/2000 | Hongu et al. ................ 423/348 |
| 6,039,801 A | * | 3/2000 | Holder et al. .................. 117/20 |
| 6,123,909 A | * | 9/2000 | Yamamoto et al. .......... 423/210 |
| 6,191,009 B1 | * | 2/2001 | Tamatsuka et al. ......... 438/471 |
| 6,197,109 B1 | * | 3/2001 | Iida et al. ...................... 117/19 |
| 6,224,668 B1 | * | 5/2001 | Tamatsuka .................... 117/84 |
| 6,291,874 B1 | * | 9/2001 | Tamatsuka et al. .......... 257/610 |
| 6,299,982 B1 | * | 10/2001 | Tamatsuka et al. .......... 428/446 |
| 6,548,886 B1 | * | 4/2003 | Ikari et al. .................... 257/610 |

FOREIGN PATENT DOCUMENTS

| | | | |
|---|---|---|---|
| DE | 2 147 514 | 3/1972 | |
| DE | 35 45 383 | 7/1987 | |
| DE | 3545383 A1 | * 7/1987 | ........... H01L/21/22 |
| EP | 0 170 788 | 2/1986 | |
| EP | 0 725 169 | 8/1996 | |
| EP | 0 829 559 | 3/1998 | |
| GB | 1 365 724 | 9/1974 | |
| JP | 57-017497 | 1/1982 | |
| JP | 05-294780 | 11/1993 | |
| JP | 06-271399 | 9/1994 | |
| JP | 07-066256 | 3/1995 | |
| JP | 07-126094 | 5/1995 | |
| JP | 07-247197 | 9/1995 | |
| JP | 408032038 A | * 2/1996 | ........... H01L/27/12 |
| JP | 10-098047 | 4/1998 | |
| JP | 11-189495 | 7/1999 | |
| JP | 19970361217 | * 7/1999 | ........... C30B/29/06 |
| JP | 2000-026196 | * 1/2000 | ........... C30B/29/06 |
| WO | 99/57344 | 11/1999 | |
| WO | WO-99/57344 | * 11/1999 | ........... C30B/29/06 |

OTHER PUBLICATIONS

Air Products and Chemicals, Inc. 2001, "Ultra–High Purity Argon (LAR/LUR) Supply Systems", in particular the Purity Information, www.airproducts.com/electronics.*
CRC Handbook of Chemistry and Physics, 82$^{nd}$ Ed., Editor–in–Chief David R. Lide, CRC Press Boca Raton 2001–2002, p. 439.*
K. P. Huber in Chapter 7 of the American Institute of Physics Handbook, Third Ed., McGraw–Hill Book Company, New York, (1982 Reissue), Coordinating Editor D.E. Gray, pp. 7–168, 7–169, 7–175 and 7–176.*
Streetman, B.N., "Solid State Electronic Devices", Prentice Hall, Englewood Cliffs, New Jersey; Third Edition (1990), pp. 13–14.*
Surma, B. et al., "Effect of Pressure treatment on Electrical Properties of Hydrogen—Doped Silicon", ASDAM'98, 2$^{nd}$ Int. Conf. on Advanced Semiconductor Devices and Microsystems, SWmolenice Castle, Slovakia, Oct. 5–7, 1998.*
Hara A. et al., "Hydrogen in As–Grown Czochralski Silion Crystals", 1993, p. 1014–1016.
Hara A. et al., "Influence of Grown–in Hydrogen on Thermal Donor Formation . . . ", 1994, p. 5577–5584.
Patent Abstract of Japan corresponding to JP 61 178 495.
Patent Abstract of Japan corresponding to JP 07 126 094.
Patent Abstract of Japan corresponding to JP 11 189 495.
English Derwent Abstract AN 1996–356122 [36] corresponding to EPO 725169.
E. Iino et al., Materials Science and Engineering 336 (1996) 146–149.
English Derwent Abstract AN 1987– 186078 [27] corresponding to DE 3545383.
English Derwent Abstract AN 2000–023590 [02] corresponding to WO 99/57344.
Patent Abstract of Japan corresponding to JP 061–271399.
Patent Abstract of Japan corresponding to JP 10–098047.
Patent Abstract of Japan corresponding to JP 07–126094.
Patent Abstract of Japan corresponding to JP 57–017497.
Patent Abstract of Japan corresponding to JP 05–294780.
Patent Abstract of Japan corresponding to JP 11–189495.
Patent Abstract of Japan corresponding to JP 07–247197.
Patent Abstract of Japan corresponding to JP 07–066256.

* cited by examiner

*Primary Examiner*—Nathan J. Flynn
*Assistant Examiner*—Johannes Mondt
(74) *Attorney, Agent, or Firm*—Collard & Roe, P.C.

(57) ABSTRACT

A semiconductor wafer made from silicon which is doped with hydrogen. The hydrogen concentration is less than $5*10^{16}$ atcm$^{-3}$ and greater than $1*10^{12}$ atcm$^{-3}$. A method for producing a semiconductor wafer from silicon includes separating the semiconductor wafer from a silicon single crystal, with the single silicon crystal being pulled from a melt, in the presence of hydrogen, using the Czochralski method. The hydrogen partial pressure during the pulling of the single silicon crystal is less than 3 mbar.

4 Claims, No Drawings

SEMICONDUCTOR WAFER MADE FROM SILICON AND METHOD FOR PRODUCING THE SEMICONDUCTOR WAFER

BACKGROUND OF THE INVENTION

1. Field of the Invention

The present invention relates to a semiconductor wafer made from silicon which has been derived from a single crystal which has been pulled from a melt using the Czochralski method (Cz method).

2. The Prior Art

A pulled single crystal of this type and a semiconductor wafer which has been separated therefrom generally have vacancy defects, known as voids. These agglomerations of vacancies cause problems during the fabrication of electronic components. It is known that, by tempering the semiconductor wafer in a pure hydrogen atmosphere at a temperature of more than 1100° C., the defects can be eliminated at least in a region of the semiconductor wafer which is close to the surface.

According to investigations carried out by E. Iino et al., which have been published in *Materials Science and Engineering* V 36 (1996) 146, the presence of hydrogen when the single crystal is being pulled using the Cz method induces a different type of defect in the single crystal. This type of defect is known as cavities, which may even make the single crystal unusable as a base material for the fabrication of electronic components.

SUMMARY OF THE INVENTION

It is an object of the present invention to substantially eliminate difficulties caused by vacancy defects.

The present invention relates to a semiconductor wafer made from silicon which is doped with hydrogen and has a hydrogen concentration which is less than $5*10^{16}$ atcm$^{-3}$, preferably less than $1*10^{16}$ atoms cm$^{-3}$ and particularly preferably less than $1*10^{15}$ atcm$^{-3}$, and greater than $1*10^{12}$ atcm$^{-3}$.

The present invention also relates to a method for producing the semiconductor wafer by separating the semiconductor wafer from a silicon single crystal, the silicon single crystal being pulled from a melt, in the presence of hydrogen, using the Czochralski method, wherein the silicon single crystal is pulled at a hydrogen partial pressure of less than 3 mbar.

Although vacancy defects continue to arise in the single crystal and the semiconductor wafers separated therefrom when the method is used, the formation of cavities, as have been described by E. Iino et al., is not observed. A hydrogen partial pressure of less than 1 mbar is particularly preferred. The partial pressure should be kept as constant as possible while the single crystal is being pulled, so that hydrogen is uniformly incorporated in the growing single crystal in the desired concentration. It should be taken into account that some of the hydrogen is driven out of the melt.

If the silicon single crystal is doped with hydrogen in the proposed concentration, the hydrogen, together with the vacancies, becomes supersaturated when the growing crystal is cooled. While the vacancies aggregate to form voids (microcavities), the hydrogen enters the voids which form or have formed. It is important that the hydrogen concentration be selected to be sufficiently low for the supersaturation which occurs. Thus the supersaturation is sufficient only for the hydrogen to be incorporated within the voids, without separate hydrogen precipitates being formed. The optimum hydrogen concentration depends on the cooling rate of the growing crystal.

During further cooling, the hydrogen in the voids substantially prevents the oxygen, which is likewise in a supersaturated concentration, from being able to oxidize the internal surfaces of the voids. Therefore, there is no layer of oxide formed, which otherwise is a significant factor in delaying the elimination of the voids by the heat treatment of the semiconductor wafer obtained from the silicon single crystal. A heat treatment of the semiconductor wafer may be at a temperature of approximately 1200° C. and for a period of 60 mm in an atmosphere which must contain at most only 3% hydrogen. This heat treatment is therefore sufficient to eliminate the vacancy defects in the region of the semiconductor material in which electronic components are provided.

In those cases in which the semiconductor wafer must in any case be exposed to the conditions outlined during the production of the components, it is desirable to dispense with the heat treatment of the semiconductor wafer. In other cases, according to the invention a tempering step is to be carried out. For the tempering step, a heat treatment of the semiconductor wafer in a hydrogen-and argon-containing atmosphere is preferred, and a heat treatment in an atmosphere which contains 97% argon and 3% hydrogen is particularly preferred. The percent of argon and hydrogen is by volume based upon the total volume of the gaseous atmosphere. It is also possible to subject the semiconductor wafer to a heat treatment in an atmosphere which contains less than 3% by volume of hydrogen and the balance substantially being argon.

The temperature and duration of the heat treatment should be made dependent on the furnace which is used. In the case of a lamp-heated rapid thermal anneal furnace (single-wafer process), a heat treatment at a temperature of from 1150° C. to 1250° C., preferably 1200° C., and with a treatment duration of up to 60 seconds, preferably 30 seconds, is selected. When using a resistance-heated furnace (batch process), a temperature of from 1050° C. to 1200° C., preferably 1100° C., and a treatment duration of up to 60 min, preferably 30 min, is to be selected.

In each case, the invention makes it possible to dispense with tempering of the semiconductor wafer in a pure hydrogen atmosphere, with the associated safety problems, and the duration of the tempering can be significantly shortened. The heat treatment may also take place under oxidizing conditions or may be combined with an oxidizing tempering step.

Furthermore, it is advantageous for the volume of the vacancy defects to be kept as low as possible, so that they can subsequently be eliminated again relatively easily. This is preferably achieved by the silicon single crystal, during pulling, additionally being doped with nitrogen and subjected to forced cooling. A suitable nitrogen concentration is between $5*10^{12}$ and $5*10^{15}$ atoms cm$^{-3}$. The nitrogen concentration is preferably selected between $1 \times 10^{14}$ and $1 \times 10^{15}$ atoms cm$^{-3}$. Suitable dopants are $NH_3$ or silicon nitride. The silicon nitride is preferably fed to the silicon melt in powder form or as a nitride-coated silicon wafer. A heat shield, which can preferably be cooled with water, is arranged around the single crystal in order to cool the single crystal.

An apparatus of this type is disclosed, for example, in EP 0 725 169 B1. The cooling preferably takes place in such a way that the period within which the single crystal which has just been grown cools from a temperature of 1050° C. to a temperature of 900° C. amounts to less than 120 min.

The semiconductor wafer which has been produced according to the invention is also particularly suitable as a substrate wafer on which an epitaxial layer is deposited.

Accordingly, while a few embodiments of the present invention have been shown and described, it is to be understood that many changes and modifications may be made thereunto without departing from the spirit and scope of the invention as defined in the appended claims.

What is claimed is:

1. A method for producing a silicon semiconductor wafer comprising pulling a silicon single crystal from a melt to form voids of aggregated vacancy defects, in the presence of hydrogen, using the Czochralski method, wherein the silicon single crystal is pulled under a hydrogen partial pressure of less than 3 mbar thus substantially preventing oxygen from oxidizing internal surfaces of the voids;

doping the silicon single crystal with nitrogen and producing a nitrogen concentration of $5*10^{12}$ atcm$^{-3}$ to $5*10^{15}$ atcm$^{-3}$; and separating the silicon semiconductor wafer from the silicon single crystal.

2. The method as claimed in claim 1, comprising placing a cooled heat shield around the silicon single crystal; and cooling the silicon single crystal with the heat shield, for a period of time within which the silicon single crystal cools from a temperature of 1050° C. to a temperature of 900° C. in less than 120 mm.

3. The method as claimed in claim 1, comprising subjecting the semiconductor wafer to a heat treatment in an atmosphere which contains less than 3% by volume of hydrogen and the balance substantially being argon.

4. The method as claimed in claim 2, comprising subjecting the semiconductor wafer to an oxidation treatment.

* * * * *